(12) United States Patent
Toyomasu et al.

(10) Patent No.: US 12,208,428 B2
(45) Date of Patent: Jan. 28, 2025

(54) LIQUID SUPPLYING DEVICE AND METHOD FOR DRAINING LIQUID THEREOF

(71) Applicant: EBARA CORPORATION, Tokyo (JP)

(72) Inventors: Fujihiko Toyomasu, Tokyo (JP); Junji Kunisawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 806 days.

(21) Appl. No.: 16/905,852

(22) Filed: Jun. 18, 2020

(65) Prior Publication Data

US 2020/0398318 A1 Dec. 24, 2020

(30) Foreign Application Priority Data

Jun. 20, 2019 (JP) .................................. 2019-114437

(51) Int. Cl.
*B08B 9/032* (2006.01)
*B24B 37/20* (2012.01)
*H01L 21/67* (2006.01)

(52) U.S. Cl.
CPC ............ *B08B 9/0321* (2013.01); *B24B 37/20* (2013.01); *H01L 21/67051* (2013.01); *B08B 2209/032* (2013.01)

(58) Field of Classification Search
None
See application file for complete search history.

(56) References Cited

U.S. PATENT DOCUMENTS

| | | | | |
|---|---|---|---|---|
| 6,758,940 | B2 * | 7/2004 | Chiu ..................... | B01D 3/007 156/345.11 |
| 7,578,886 | B2 * | 8/2009 | Yamada ............... | C25D 17/001 134/21 |
| 7,635,410 | B2 * | 12/2009 | Park .................... | B01D 19/0036 96/219 |
| 9,146,007 | B2 * | 9/2015 | Schwaiger ........ | H01L 21/67051 |
| 9,625,168 | B2 * | 4/2017 | Shinohara ............... | F04B 37/14 |
| 10,281,349 | B2 * | 5/2019 | Hasunuma ............ | G01L 19/069 |
| 2020/0398318 | A1 * | 12/2020 | Toyomasu ........ | H01L 21/67017 |

FOREIGN PATENT DOCUMENTS

| JP | 9126929 A | * 5/1997 |
|---|---|---|
| JP | 2006269677 | 10/2006 |
| JP | 2006319060 | 11/2006 |
| JP | 2006334540 | 12/2006 |
| JP | 2008128145 | 6/2008 |
| JP | 2010050436 | 3/2010 |
| JP | 2018181883 | 11/2018 |

* cited by examiner

*Primary Examiner* — Sylvia MacArthur
(74) *Attorney, Agent, or Firm* — JCIPRNET

(57) ABSTRACT

To improve liquid draining of a liquid supplying device. A method for draining a liquid of a pipe of a liquid supplying device including a step for drying an inside of the pipe by circulating an inert gas in the pipe without dividing the pipe, wherein the step for drying includes a step for protecting a pressure sensor from static electricity, through a pressure sensor that has a sensor covered portion electrically connected with a housing of the liquid supplying device, the sensor covered portion is exposed to the inside of the pipe or exposed to a flow path communicating with the inside of the pipe.

6 Claims, 6 Drawing Sheets

LIQUID SUPPLYING DEVICE AND METHOD FOR DRAINING LIQUID THEREOF

CROSS-REFERENCE TO RELATED APPLICATION

This application claims the priority benefits of Japanese application no. 2019-114437, filed on Jun. 20, 2019. The entirety of the above-mentioned patent application is hereby incorporated by reference herein and made a part of this specification.

BACKGROUND

Technical Field

The disclosure relates to a liquid supplying device and a method for draining liquid of the liquid supplying device.

Description of Related Art

In a substrate processing device such as a semiconductor manufacturing device, a liquid processing device and a liquid supplying device are used for liquid processing for a cleaning process, plating process, etching process, polishing process, developing process and the like. For example, a CMP (Chemical Mechanical Polishing) device, which is an example of a polishing device, includes a polishing unit for polishing a surface of the semiconductor substrate that has a semiconductor chip formed on it, a cleaning unit that supplies cleaning agent while cleaning the semiconductor substrate which was polished by the polishing unit. The polishing unit receives a supply of slurry from a slurry supply unit, and supplies the slurry to the polishing pad and polishes the semiconductor substrate by the opposite rotations of the semiconductor substrate and the polishing pad (For example, refer to Patent Literature 1). The cleaning unit supplies cleaning agent to the semiconductor substrate that has been polished and cleans it (For example, refer to Patent Literature 2).

LITERATURE OF RELATED ART

Patent Literature

Patent Literature 1: Japanese Laid-Open No. 2010-50436
Patent Literature 1: Japanese Laid-Open No. 2018-181883

During moving of the device (shipping of the device, replacement of the device), for the purpose of ensuring safety when transporting the device and the purpose of preventing growth of bacteria and such in the piping, there is a need for draining the liquid in the pipe of the liquid supplying device (For example, the liquid supply unit, the cleaning unit). In addition, liquid in the piping of the device may need to be drained during maintenance. For draining the liquid by dividing the pipes, a work space is required near the pipe connection and requires a lot of work time for dividing work. Furthermore, the pipe needs to be reassembled after liquid is drained, and a leak may occur from the reconnected pipe connections due to the reassembly. In addition, in recent years, there is a demand for downsizing of the liquid supplying device, and the number of detachable pipe connections (such as unions) tends to be reduced due to integration. Therefore, it is expected that draining the liquid by dividing the piping will become difficult.

A purpose of the disclosure is to resolve at least a portion of the above described issues.

SUMMARY

According to one aspect of the disclosure, a method for draining a liquid of a pipe of a liquid supplying device including a step for drying an inside of the pipe by circulating an inert gas in the pipe without dividing the pipe of the liquid supplying device, wherein the step for drying includes a step for protecting a pressure sensor from a static electricity by electrically connecting a sensor covered portion of the pressure sensor with a housing of the liquid supplying device, the sensor covered portion is exposed to the inside of the pipe or exposed to a flow path communicating with the inside of the pipe.

DESCRIPTION OF THE EMBODIMENTS

Figure 1:
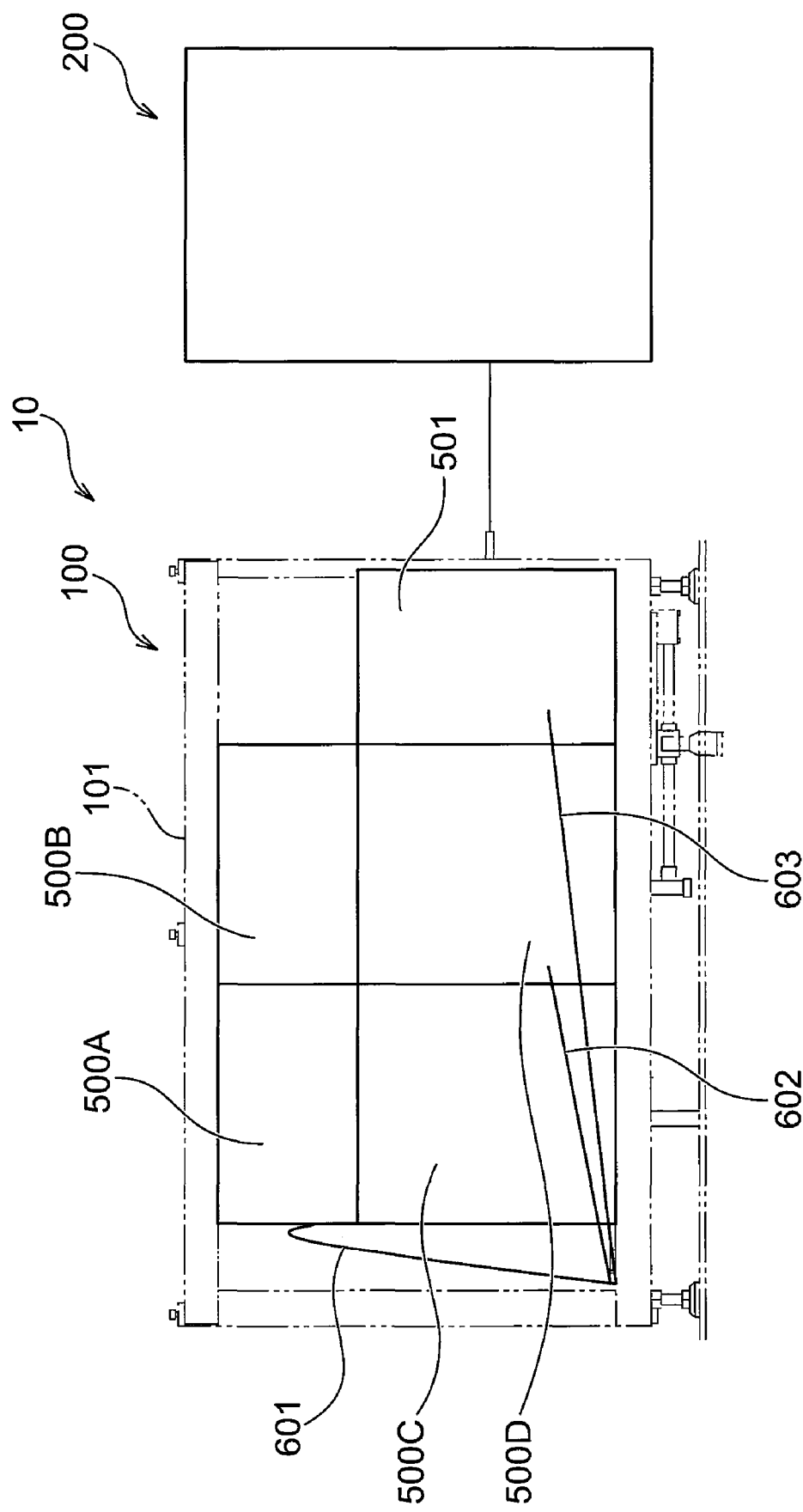
FIG. 1 is a schematic front view illustrating a liquid supplying device according to one embodiment of the disclosure.

Hereinafter, embodiments of the present invention will be described with reference to the accompanying drawings. In the drawings described hereinafter, identical or equivalent components are assigned identical reference numerals and duplicate description is omitted. Although a chemical cleaning device will be described hereinafter as an example of a liquid supplying device, without being limited to this, the present invention includes any liquid supplying device that can supply a liquid to a cleaning device. The liquid supplying device, for example, includes a cleaning unit, a polishing unit, an etching unit, a developing unit, and a plating unit, and, at least one unit supplying a liquid to the aforementioned units. The liquid includes at least one of a chemical, pure water or the like. In the description below, DIW (De-Ionized Water) is described as one example of pure water, however a liquid other than DIW may be used.

Figure 2:
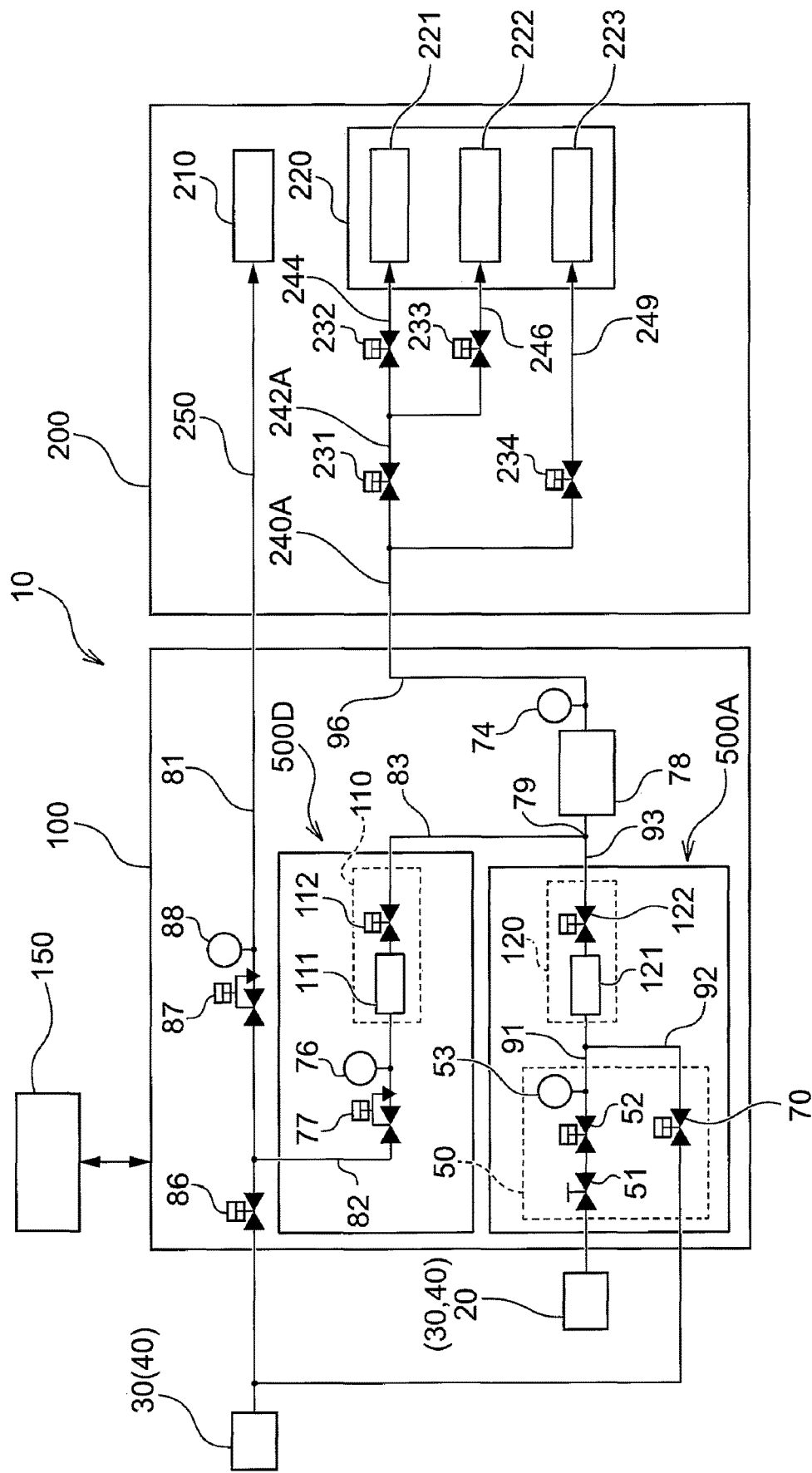
FIG. 2 is a fluid circuit diagram of the liquid supplying device according to one embodiment of the disclosure.

FIG. 1 is a schematic front view illustrating a liquid supplying device according to one embodiment of the disclosure. FIG. 2 is a fluid circuit diagram of the liquid supplying device according to one embodiment of the disclosure. In the present embodiment, as one example of the liquid supplying device, a cleaning device 10 is described as an example. The cleaning device 10 is an example of a substrate processing device. In addition, a liquid supply unit 100 and a cleaning unit 200 constituting the cleaning device 10, are each an example of a liquid supplying device independently. The cleaning unit 200 is an example of a processing device.

The cleaning device 10 includes the liquid supply unit 100 that supplies cleaning chemical to the cleaning unit 200, and the cleaning unit 200 which supplies cleaning chemical to a to-be-cleaned object (below, referred to as, simply, substrate) to be washed while cleaning the to-be-cleaned object (FIG. 2). The cleaning device 10, is a cleaning unit used in a cleaning procedure during, for example, a polishing process such as CMP, a plating process, an etching process, or a development process, and a part or all of the cleaning device 10 is provided on the polishing device, the plating device, the etching device or the developing device as a single body or a separate body.

The liquid supply unit 100 is configured to supply an acidic or alkaline chemical to the cleaning unit 200. The chemical may be at room temperature or at a high temperature (for example a temperature of about 80 degrees Celsius). As shown in FIG. 1 the liquid supplying device 100 includes a housing 101, the chemical utility boxes 500A, 500B and 500C which include a flow rate control device (here, chemical CLC 121 described later), a DIW utility box 500D that includes a flow rate control device (here, DIWCLC 111 described later), a device area 501 in which other devices such as valves, regulators, pressure sensors are disposed. In the present embodiment, a CLC (Closed Loop Controller) detailed later is described as an example of a flow rate control device, however, the flow rate control device may be a flow rate control device with a configuration other than the CLC. The chemical utility boxes 500A-500C, the DIW utility box 500D and the device area 501 are housed in the housing 101. The liquid supply unit 100 has a piping (flow path), a valve, a pressure sensor and the like for transporting the DIW or chemical. Details are described in FIG. 2. In this example, 4 utility boxes are disposed on the liquid supply unit 100, however, this is one example, and the number of utility boxes and/or the type of each utility box (chemical utility box, DIW utility box) may be changed according to the specification of the cleaning device.

In FIG. 2, as one example of the chemical utility box, only the chemical utility box 500A is shown. In addition, the chemical utility boxes 500A-500C have substantially the same configuration, and the chemical utility box 500A is described below and the description of the other chemical utility boxes will be omitted. In a case when a plurality of types and/or a plurality of lines of chemical are used, a plurality of chemical utility boxes are used. The chemical utility box 500A is configured to supply chemical from a chemical supply source 20 to an in-line mixer 78 that is described later. In addition, the chemical utility box 500A controls a flow rate of the chemical to a set flow rate through feedback control. The DIW utility box 500D is configured to supply DIW from a DIW supply source 30 to the in-line mixer 78 that is described later. Furthermore, the DIW utility box 500D can control a flow rate of the DIW to a set flow rate through feedback control.

As shown in FIG. 2, the liquid supply unit 100 is configured to be in fluid communication with the DIW supply source 30 that supplies the DIW and the chemical supply source 20 that supplies the chemical respectively, via piping. In addition, the liquid supply unit 100 is configured to be in fluid communication with the cleaning unit 200. More specifically, the liquid supply unit 100 supplies DIW and diluted chemical (cleaning chemical) to the cleaning unit 200.

The cleaning unit 200 includes a DIW cleaning part 210 for cleaning, for example, substrates such as a semiconductor substrate, a glass substrates (FPD) and the like using DIW, a chemical cleaning part 220 for cleaning, for example, substrates such as a semiconductor substrate, a glass substrate (FPD) and the like using diluted chemical (cleaning chemical). The DIW cleaning part 210 is composed of, for example, an ultrasonic water cleaning part or some other DIW cleaning part. The chemical cleaning part 220 includes an upper nozzle 221 facing a top surface of a substrate that is the to-be-cleaned object, a lower nozzle 222 facing a bottom surface of the substrate, and a standby part 223 in which the substrate is placed for waiting before being cleaned. The top surface of the substrate is cleaned using the cleaning chemical supplied to the upper nozzle 221, and the lower surface of the substrate is cleaned using the cleaning chemical supplied to the lower nozzle 222. In addition, the cleaning chemical supplied to the standby part 223, is supplied to the substrate in standby from a nozzle not shown. Furthermore, it is possible for the cleaning unit 200 to clean a substrate before film formation (substrate with pattern exposed), or a substrate after film formation (substrate after plating). In addition, the cleaning unit 200 may treat any object other than the semiconductor substrate and the glass substrate (FPD) as the to-be-cleaned object.

The liquid supply unit 100 includes the in-line mixer 78, the chemical utility box 500A and the DIW utility box 500D. The in-line mixer 78 mixes the chemical with the DIW to generate the cleaning chemical. The chemical utility box 500A provides feedback control of a flow rate of the chemical supplied from the chemical supply source 20 to the in-line mixer 78. The DIW utility box 500D provides feedback control of a flow rate of the DIW supplied from the DIW supply source 30 to the in-line mixer 78. A control device 150 controls each part of the liquid supply unit 100 and the cleaning unit 200.

The control device 150 may include one or a plurality of, for example, a control device provided for the liquid supply unit 100, a control device provided for the cleaning unit 200, a control device provided for the cleaning device 10, a control device provided for the substrate processing device (such as the polishing device) having the cleaning device 10 disposed thereon. The control device 150 includes a computer or a control circuit such as microcomputer or sequencer, and a storage media (one or a plurality of memory such as volatile memory, non volatile (non-transitory) memory) that stores a program executed by the control circuit. The program includes, for example, a program for the liquid supply unit 100 and the cleaning unit 200 to execute the supplying of the chemical (chemical after dilution) and cleaning, and a program for draining the liquid of the pipe (described later). Each part of the liquid supply unit 100 and the cleaning unit 200 is controlled according to the program. In addition, the program mentioned above may be stored in the control device 150 in a removable storage medium (CD, flash memory, etc.). Furthermore, the program mentioned above may be stored in a storage medium that can be read by the control device 150 via a wire or wirelessly.

(DIW Utility Box)

The DIW utility box 500D includes a DIW supply valve 112, a DIWCLC 111 (one example of a flow rate control device), a pressure sensor 76, and a DIW pressure regulator 77. The control device 150 performs the open/close control for the DIW supply valve 112, to switch the DIW supply ON and OFF from the DIW CLS 111 to the in-line mixer 78. The DIWCLC 111 is a flow rate control valve having a closed loop control function, and is controlled by the control device 150, and measures the flow rate of the DIW supplied to the in-line mixer 78, and controls the flow rate according to the measured value. More specifically, the DIWCLC 111 adjusts (feedback control) a degree of opening of the control valve that is inside the DIWCLC 111 according to the measured flow rate of DIW, such that the desired flow rate for the flow rate of the DIW flowing in the DIWCLC 111 is achieved. The DIW utility box 500D supplies the DIW to the in-line mixer 78 by opening the DIW supply valve 112. A degree of opening of the DIW pressure regulator 77 is controlled by the control device 150, to adjust the supply pressure of the DIW from a DIW supply pipe 81 to the CIW CLC 111. The pressure sensor 76 is disposed between the DIW pressure regulator 77 and the DIWCLC 111, and measures the pressure of the DIW flowing into the DIWCLC 111, and outputs the measured value to the control device 150.

In addition, in FIG. 2, the reference numeral 110 illustrates a range included by the CLC box in a case when the CLC box (DIW supply valve 112, DIWCLC 111) is disposed as a separate individual box (module) with the pressure sensor 76 and the DIW pressure regulator 77. In the present embodiment, a CLC box 110, the pressure sensor 76, and the DIW pressure regulator 77 which were configured to be disposed separately (for example, refer to FIG. 1 and FIG. 2 of Patent Literature 2) are integrated into one module, that is the DIW utility box 500D. By the configuration of integrating into one DIW utility box 500D, the pipes connecting the CLC box with each of the components can be consolidated in a single module, and downsizing of the liquid supply unit may be achieved.

The liquid supply unit 100 includes the DIW supply pipe 81 having one end connected with the DIW supply source 30, and an other end connected with the DIW cleaning part 210 via a pipe 250 of the cleaning unit 200. The DIW supply pipe 81 has a DIW supply valve 86, a DIW pressure regulator 87, and a DIW pressure sensor 88. The control device 150 performs the open/close control for the DIW supply valve 86, to control a supply of the DIW from the DIW supply source 30 to the DIW supply pipe 81. A degree of opening of the DIW pressure regulator 87 is controlled by the control device 150, to adjust the supply pressure of the DIW from a DIW supply pipe 81 to the DIW cleaning part 210. The DIW pressure sensor 88 measures the pressure of the DIW passing through the inside of the DIW supply pipe 81, and outputs the measured value to the control device 150.

One end of a DIW branch pipe 82 is connected between the DIW supply valve 86 and the DIW pressure regulator 87 of the DIW supply pipe 81. An other end of the DIW branch pipe 82 is connected with the DIWCLC 111 of the DIW utility box 500D via the DIW pressure regulator 77 and the pressure sensor 76. One end of a DIW pipe 83 is connected with the DIWCLC 111. An other end of the DIW pipe 83 is connected with a chemical pipe 93 at a junction 79, and is in fluid communication with the in-line mixer 78. The junction 79, in FIG. 2, is a point where the DIW from the DIWCLC 111 and the chemical from a chemical CLC 121 merge. The DIW supply valve 112 is disposed on the DIW pipe 83, and the open/close control is performed by the control device 150 in a case when the DIW is supplied to the in-line mixer 78.

(Chemical Utility Box)

The chemical utility box 500A has a chemical supply valve 122, and the chemical CLC 121 (one example of a flow rate control device). In addition, the chemical utility box 500A further includes a manual valve 51 disposed on the chemical pipe 91 connecting the chemical supply source 20 with the chemical CLC 121, a chemical inlet valve 52 to switch the supply of chemical to the chemical CLC 121 ON and OFF, and a pressure sensor 53 measuring the fluid pressure in the chemical pipe 91. In addition, the chemical utility box 500A further includes a DIW inlet valve 70 disposed on a DIW pipe 92 connecting the DIW supply source 30 with the chemical CLC 121.

In addition, in FIG. 2, each reference numeral 120 and 50 illustrates the components which are included in each box in a case when the CLC box and the chemical utility box are each provided individually. In the present embodiment, a CLC box 120, and a chemical utility box 50 which are configured to be disposed in separate boxes (modules) (for example, refer to FIG. 1 of Patent Literature 2) are integrated into 1 module, that is the chemical utility box 500A. By the configuration of integrating into one chemical utility box 500A, the pipes between each box (module) can be consolidated in a single box, and a downsizing of the liquid supply unit may be achieved. The manual valve 51 may be disposed outside of the chemical utility box 500A.

The control device 150 performs the open/close control for the chemical supply valve 122, to switch the chemical supply from the chemical CLC 121 to the in-line mixer 78 ON and OFF. The chemical CLC 121 is a flow rate control valve having a closed loop control function, and is controlled by the control device 150, and measures the flow rate of the chemical supplied to the in-line mixer 78 via the chemical supply valve 122, and controls the flow rate according to the measured value. More specifically, the chemical CLC 121 adjusts (feedback control) a degree of opening of the control valve inside the chemical CLC 121 according to the measured flow rate of the chemical, such that the desired flow rate for the flow rate of the chemical flowing in the chemical CLC 121 is achieved.

The manual valve 51 is a valve that is opened and closed manually, and is used, for example, when disconnecting the chemical supply source 20 from the cleaning liquid supply unit 100 during maintenance. The control device 150 performs the open/close control for the chemical inlet valve 52, to control a supply of the chemical from the chemical supply source 20 to the chemical CLC 121. The pressure sensor 53 is configured to measure the pressure on the IN side (first side) of the chemical CLC 121, that is the pressure of the chemical that is supplied from the chemical supply source 20, and measures the pressure of the chemical flowing into the chemical CLC 121, and outputs the measured value to the control device 150. The pressure sensor 53 may be disposed between the manual valve 51 and the chemical inlet valve 52. In addition, as in FIG. 2, according to the configuration of disposing the pressure sensor 53 between the chemical inlet valve 52 and the chemical CLC 121, the supply pressure of the chemical from the chemical supply source 20 may be measured in a state when the chemical inlet valve 52 is open and the DIW inlet valve 70 is closed. In addition, the supply pressure of the DIW from the DIW supply source 30 may be measured in a state when the chemical inlet valve 52 is closed and the DIW inlet valve 70 is open. A pressure sensor for measuring the supply pressure of the chemical from the chemical supply source 20, and a pressure sensor for measuring the supply pressure of the DIW from the DIW supply source 30 may each be disposed on, for example, the chemical pipe 91 and the DIW pipe 92 respectively. Beside this configuration, one or a plurality of pressure sensors may be provided for measuring the supply pressure of the chemical from the chemical supply source 20 and/or the DIW from the DIW supply source 30.

The control device 150 performs the open/close control for the DIW inlet valve 70, to control a supply of the DIW from the DIW supply source 30 to the chemical CLC 121. The pipe 92 is connected with the chemical pipe 91 at an inlet side of the chemical CLC 121. In other words, the inlet side of the chemical CLC 121 is connected with the chemical supply source 20 via the chemical pipe 91, and is connected with the DIW supply source 30 via the DIW pipe 92. The liquid supplied to the inlet side of the chemical CLC 121 can be switched between the chemical and the DIW by the chemical inlet valve 52 and the DIW inlet valve 70. For example, in a case when pipe cleaning (flushing) is performed, the chemical inlet valve 52 is in the closed state and the DIW inlet valve 70 is in the open state, and the DIW is supplied to the chemical CLC 121, and the piping of the chemical supply path is cleaned.

The chemical pipe 93 that is in fluid communication with the in-line mixer 78 is connected with the chemical CLC 121 of the chemical utility box 500A. The chemical supply valve 122 is disposed on the chemical pipe 93, and the control device 150 performs the open/close control in the case when chemical is supplied to the in-line mixer 78. In addition, a cleaning chemical pipe 96 which has one end connected with the chemical cleaning part 220 is connected with the in-line mixer 78. A pressure sensor 74 is disposed at an OUT side (second side) of the in-line mixer 78. The DIW from the DIWCLC 111 of the DIW utility box 500D, and the chemical from the chemical CLC of the chemical utility box 500A merge at the junction 79 of the DIW pipe 83 and the chemical pipe 93, such that the pressure at the OUT side (second side) of the DIWCLC 111 is the same as the pressure at the OUT side of the chemical CLC 121. Therefore, the pressure sensor 74 is able to measure the pressure at the OUT side of the DIWCLC 111 and the chemical CLC 121. In other words, the pressure sensor 74 measures the pressure of the liquid flowing from the DIWCLC 111 and the chemical CLC 121, and outputs the measured value to the control device 150.

The DIWCLC of the DIW utility box 500D and the chemical CLC 121 of the chemical utility box 500A are configured to receive a signal (flow rate setting value) showing a predetermined flow rate setting value from the control device 150. The degree of opening of the control valve inside the DIWCLC 111 and the chemical 121 are controlled according to the flow rate setting value.

Example Configuration of CLC

Figure 3:
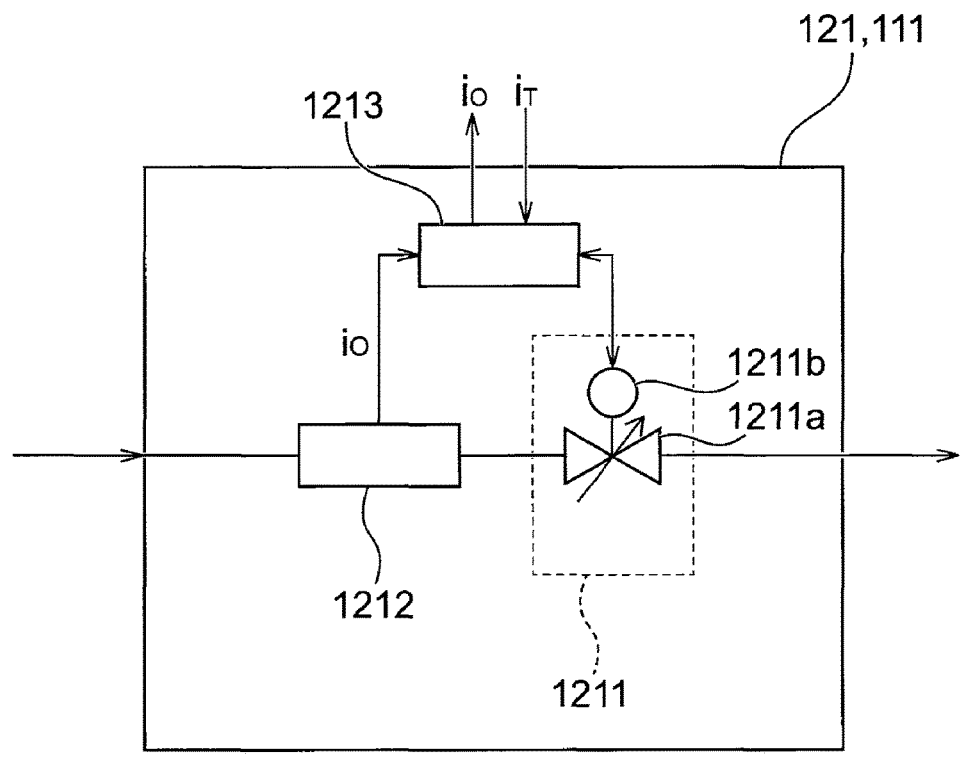
FIG. 3 is a diagram illustrating an example configuration of a flow rate control device.

FIG. 3 is a diagram illustrating an example configuration of a flow rate control device. Here, the CLC 121 which is one example of a flow rate control device is depicted. In addition, the configuration of the CLC 111 and the configuration of the CLC 121 are the same, and the CLC 121 will be described as an example. The CLC 121 includes a flow meter 1212, a flow rate control valve (internal control valve) 1211, and a control part 1213. The flow meter 1212 of the CLC 121 is, for example, a differential type flow meter (orifice flow meter). The differential type flow meter is a type of flow meter which detects a pressure difference between the IN side and the OUT side the flow meter, and measures the flow rate according to the pressure difference. In addition, an ultrasonic flow meter may be adopted as the flow meter 1212. The flow rate control valve 1211, in the present embodiment is a motor valve, and the degree of opening of the valve itself 1211a is controlled by the driving force of the drive source 1211b that is equipped with a motor. The flow rate control valve 1211 may be a valve in which the degree of opening is adjustable, and may be another type of variable flow rate valve (for example, a solenoid valve driven by a solenoid or the like). The control part 1213 includes a control circuit such as a micro computer, and a memory that stores a program executed by the control circuit. The control circuit and the memory are mounted on, for example, a control board. The control part 1213 receives the flow rate setting value $i_T$ of the fluid from the control device 150, and receives the flow rate detection value $i_O$ of the fluid from the flow meter 1212, and a feedback control is performed on the flow rate control valve 1211 such that the flow rate detection value $i_O$ matches the flow rate setting value $i_T$.

In addition, a flow rate control valve unit (CLC) that includes the flow meter, the flow rate control valve, and the control part is depicted here as an example, however, a portion or all of the parts may be provided separately. For example, the flow meter 1212 and the flow rate control valve 1211 may be provided separately, and instead of the control part 1213 (or via the control part 1213), the control device 150 controls the flow rate control valve 1211 according to the detected value from the flow meter 1212, to control the flow rate. The control device 150 may control the flow rate control valve 1211 via another drive circuit as needed.

(Pipe Configuration)

Returning to FIG. 2, the cleaning chemical pipe 96 is connected with one end of a pipe 240A of the cleaning unit 200. The pipe 240A is a branch pipe, and branches at the branching part, and each of the ends of the pipe after branching is connected to one end of a valve 231 and a valve 234. An other end of the valve 231 is connected with one end of a pipe 242A. The pipe 242A is a branch pipe, and branches at the branching part, and each end of the pipe after branching is connected to one end of a valve 232 and a valve 233. An other end of the valve 232 is connected with the upper nozzle 221 of the chemical cleaning part 220 via the pipe 244, and an other end of the valve 233 is connected with the lower nozzle 222 of the chemical cleaning part 220 via the pipe 246. An other end of the valve 234 is connected with the standby part 223 via a pipe 249. The valves 231, 232, 233, and 234 are open/close valves and are controlled to be opened/closed by the control device 150.

Figure 6:
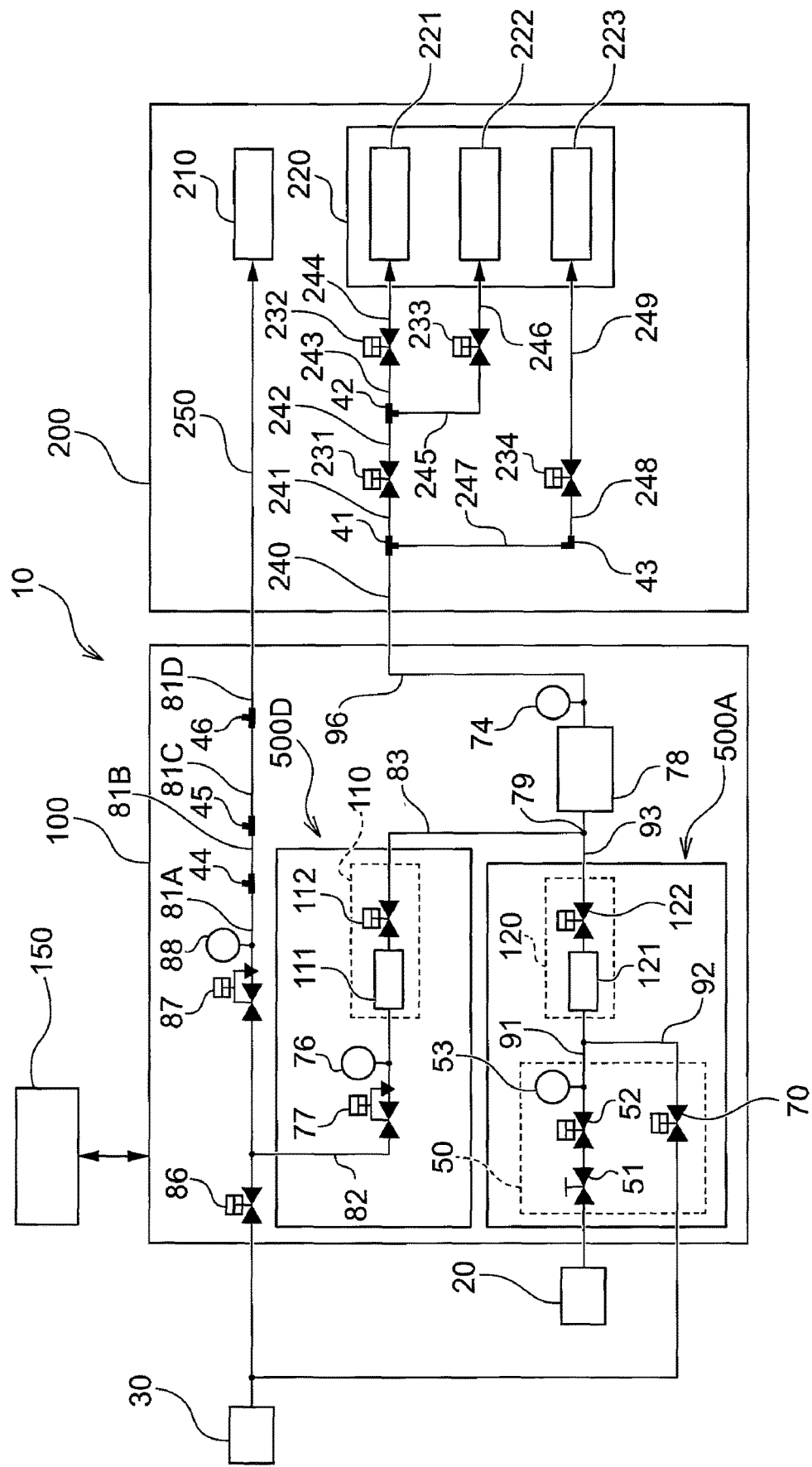
FIG. 6 is a fluid circuit diagram of a liquid supplying device according to a comparative example.

FIG. 6 is a fluid circuit diagram of a liquid supplying device according to a comparative example. Components that are the same as in FIG. 2 are designated by the same reference numerals, and detailed description of same components will be omitted. The configurations differing from FIG. 2 are described below.

In the cleaning device 10 according to the comparative example, the cleaning chemical pipe 96 is connected with the upper nozzle 221 via the pipe 240, the pipe 241, the pipe 242, the pipe 243, and the pipe 244, and is connected with the lower nozzle 222 via the pipe 240, the pipe 241, the pipe 242, the pipe 245, and the pipe 246, and is connected with the standby part 223 via the pipe 240, the pipe 247, the pipe 248, and the pipe 249. In addition, the DIW supply source 30 is connected to the DIW cleaning unit 210 via the pipes 81A, 81B, 81C, 81D and the pipe 250. By connecting the pipe 240, the pipe 241, and the pipe 247 via the joint 41, the pipe 240 is branched into the pipe 241 and the pipe 247. By connecting the pipe 242, the pipe 243, and the pipe 245 via the joint 42, the pipe 242 is branched into the pipe 243 and the pipe 245. The pipe 247 and the pipe 248 are connected via the joint 43. In addition, the pipe 81A and the pipe 81B are connected via the joint 44, the pipe 81B and the pipe 81C are connected via the joint 45, and the pipe 81C and the pipe 81D are connected via the joint 46. Here, the joints 41~46 are detachable joints (for example, referred to as unions) that use an attachment structure such as a screw. Therefore, the pipes connected by the joints 41~46 can be separated from each other and can be connected again.

In the cleaning device 10 (FIG. 2) according to the present embodiment, the pipes 240, 241, 247, 248 in the cleaning device 10 of the comparative example are integrally formed as the pipe 240A by omitting the joints 41, 43, and the pipes 242, 243, and 245 in the cleaning device 10 of to the comparative example are integrally formed as the pipe 242A by omitting the joint 42. In addition, the pipes 81A~81D in the cleaning device 10 of the comparative example are integrally formed as the pipe 81 by omitting the joints 44~46. Further, the configuration of FIG. 2 is one example of the removable joint being omitted, and other configuration in which some joints are not omitted may be adopted. For example, the joint 43 may be omitted and the pipes 247, 248 may be integrally formed.

Here, integrally formed refers to integrally forming or connecting the pipes so as to be non-detachable, and without the detachable joint (detachable pipe connecting part). For example, a case where a plurality of pipes are connected by welding (welding joint) also corresponds to a case of integrally formed. In the disclosure, when simply referred to as "joint", it means a detachable joint (not including a welding joint) using an attachment structure such as a screw. Therefore, in the cleaning device 10 (FIG. 2) according to the present embodiment, the joint is omitted and the pipe is integrally formed means a detachable joint (union) is not used, and the pipe is integrally formed by welding using a welding joint (adapter), or that a single pipe is used (including a pipe that has been through a bending treatment).

(Process for Draining Liquid of the Pipe)

The cleaning device of the present embodiment has a plurality of pipes integrated by reducing the number of joints as compared with the configuration of the comparative example. The joint (union) of the pipe is configured to have a threaded portion at each end to be screwed into the pipe. Therefore, by reducing the number of joints and reducing the number of threaded portion on the flow path, the risk of liquid leakage due to the loosening of the threaded portion can be suppressed. In addition, the piping can be consolidated (detachable joints of the connecting parts can be eliminated, and the flow path can be shortened simply). On the other hand, in the case when the number of detachable joints is reduced, it becomes difficult to divide the pipes and drain the liquid. Especially when the branch part is formed integrally without a joint, even if the branch pipe including the branch part is separated, it may not be possible to drain the liquid of the branch part sufficiently, or it may take a long time to drain the liquid of the branch part.

Therefore, in the present embodiment, the liquid inside the pipe is drained by circulating inert gas in the pipe without separating or dividing the pipe. In the present embodiment, nitrogen gas is used as the inert gas. However, other inert gas such as argon may be used. The supply pressure of the inert gas is set to, for example, 200 kPa~300 kPa. This is a pressure sufficiently higher than the pressure conventionally used in purging the inside of the pipe with an inert gas (for example, less than 100 kPa). By circulating a large flow rate (high pressure) of inert gas in the pipe, the moisture in the pipe can be blown off by the nitrogen gas, and the inside of the pipe can be dried in a short time.

In a case when an inert gas is circulated at a large flow rate (high pressure) in order to shorten the work time for draining the liquid, the pressure sensor, which is an important device in terms of the operation of the device and for safety, there is a fear the sensor element may be destroyed by static electricity due to the sensor being charged with static electricity at a sensor covered portion from friction with the inert gas. In addition, in a case when the pipe is made of an electrically insulating material such as fluororesin, static electricity accumulates on the inner wall of the pipe due to friction between the inner wall of the pipe and the inert gas, and it is possible that this static electricity may electrify or discharge on the sensor covered portion. As a countermeasure against this, in the present embodiment, the sensor covered portion of the pressure sensor is electrically connected to the housing 101 by wiring and electrically grounded. The sensor covered portion is the pressure detecting part of the pressure sensor that is exposed to the inside of the pipe or to a flow path communicating with the inside of the pipe. The sensor covered portion, for example, in the case of a diaphragm type pressure sensor, is the diaphragm or a protective film covering the diaphragm.

(Pressure Sensor)

Figure 4:
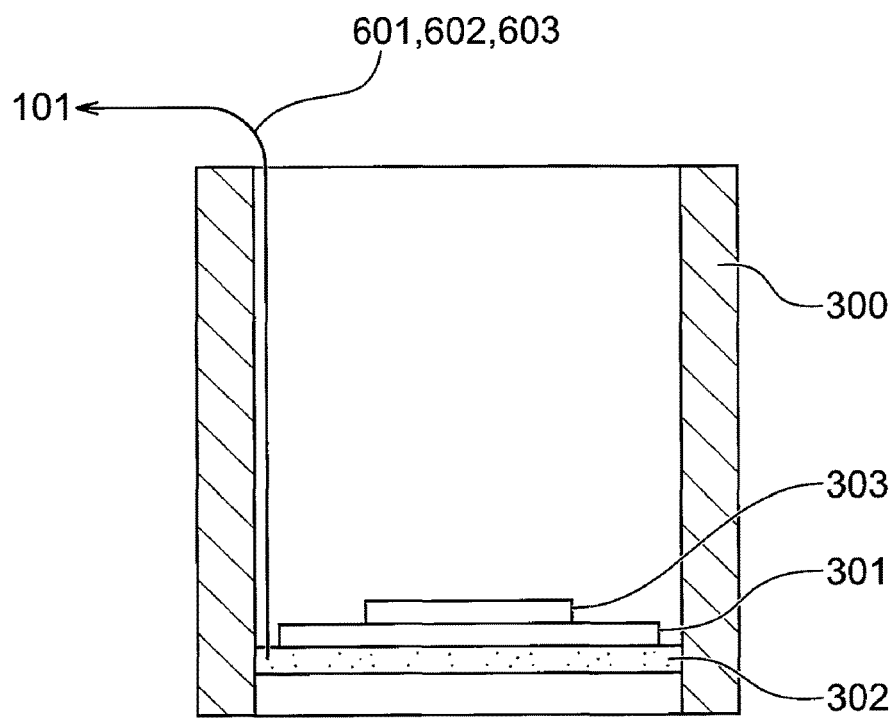
FIG. 4 is a schematic diagram illustrating one example of a grounding structure of a pressure sensor.

FIG. 4 is a schematic diagram illustrating one example of a grounding structure of a pressure sensor. In one example, the pressure sensor is configured to include a housing 300, a diaphragm 301 disposed in the housing 300, a protective film (sensor covered portion) 302 that shuts off a contact between the diaphragm 301 and the fluid, and a sensor element 303 such as a strain gauge. The sensor covered portion 302 is exposed to the inside of the pipe or to a flow path communicating with the inside of the pipe (for example, a flow path branching from the pipe). The diaphragm 301 is formed of an electrically insulating material such as sapphire or ceramic. The sensor covered portion 302 and the housing 300 may be formed of an electrically insulating material whose main composition is fluororesin which has excellent chemical resistance properties, or a conductive material. In the present embodiment, in order to suppress or prevent the accumulation of static electricity on the sensor covered portion 302, the sensor covered portion 302 is electrically grounded to the inner wall of the housing 101 by wire.

More specifically, the sensor covered portion 302 of the pressure sensor 53 in the chemical utility box 500A is electrically connected to the inner wall of the housing 101 of the liquid supply unit 100 (FIG. 1, FIG. 2, FIG. 4) by the wire 601. In addition, the sensor covered portion 302 of the pressure sensor 76 in the DIW utility box 500D is electrically connected to the inner wall of the housing 101 of the liquid supply unit 100 by the wire 602. Furthermore, the sensor covering portion 302 of the pressure sensors 74, 88 in the device area 501 are electrically connected to the inner wall of the housing 101 of the liquid supply unit 100 by one or a plurality of wires 603. From the viewpoint of electrical grounding, it is preferable that each wire is connected to the inner wall near the leg of the housing 101 closer to the installation surface of the liquid supply unit 100, however, may be connected to any part of the housing 101 as long as the electrical grounding of the sensor covered portion of each pressure sensor can be sufficiently secured.

In addition, in the case when the pressure sensor is disposed in the pipe in the cleaning unit 200, similarly, the sensor covered portion of the pressure sensor may be electrically grounded to the housing of the cleaning unit 200, to protect the pressure sensor from static electricity.

(Flow Chart)

Figure 5:
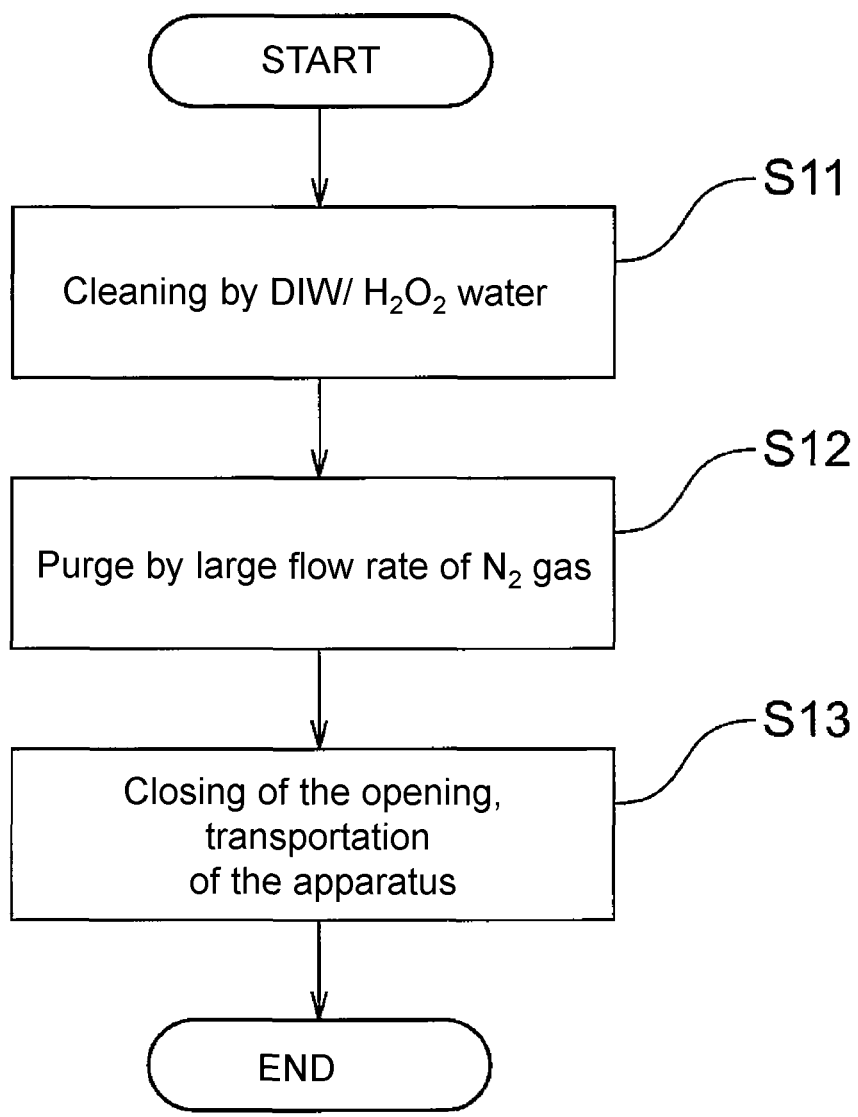
FIG. 5 is a work flow chart for draining liquid in a piping.

FIG. 5 is a work flow chart for draining liquid in a piping. This process is executed by the control device 150 or by the control device 150 in cooperation with another control device. In addition, the control device 150 may include one or a plurality of, for example, a control device provided for the liquid supply unit 100, a control device provided for the cleaning unit 200, a control device provided for the cleaning device 10, a control device provided for the substrate processing device (such as the polishing device) having the cleaning device 10 disposed thereon.

In step S11, the DIW is circulated in the pipe of the cleaning device 10 to clean the inside of the pipe. For example, in FIG. 2, the chemical valve 52 is closed, the DIW inlet valve 70 is opened, and the DIW is circulated from the DIW supply source 30 to the chemical cleaning part 220 via the CLC box 120, such that the inside of the pipe is replaced with DIW, and the pipe is cleaned (flushing). At this time, even if high-purity DIW is used and/or the inside of the pipe is flushed with a large flow rate of DIW, as described above, it is possible to flush the inside of the pipe in a short time period while protecting the pressure sensor, since the sensor covered portion of the pressure sensor is electrically grounded to the housing. Furthermore, the flushing process may be performed not only when draining the liquid, but also when the chemical in the pipe is replaced with DIW or the like.

In the above flushing process, it is preferable to provide a predetermined delay time Δts (for example, 0.1 seconds) from closing the chemical inlet valve 52 to opening the DIW inlet valve 70. It is possible to prevent the pressure in the pipe between the CLC 121 and the chemical inlet valve 52 from rising. As a result, a measured value upper limit error (pressure upper limit error, flow rate upper limit error), in which the measured value of the flow meter and/or the pressure meter 53 that are included in the CLC 121 overshooting may be suppressed.

In the liquid supply unit 100 of the present embodiment, as described above, the conventional CLC box 120 and the utility box 50 are consolidated as the chemical solution utility box 500A to achieve downsizing, therefore, a distance between the chemical inlet valve 52 and the CLC 121 is shortened, and a volume of the piping at this section is small. As such, when the DIW inlet valve 70 is opened at the same time when the chemical inlet valve 52 is closed, the DIW flows in from the DIW inlet valve 70 into the small volume of the pipe between the chemical inlet valve 52 and the CLC 121, such that the pressure in the pipe at this section rises sharply (spike). As a result, there is a fear that the detected value of the flow meter 1212 (FIG. 3) of the CLC 121 may overshoot, causing a pressure (flow rate) upper limit error. It is considered that a liquid volume of a few cc flowing into the pipe having a small volume may cause a sharp rise in pressure for the integrated module. Therefore, the predetermined delay time its is provided between the timing t1 at which the chemical inlet valve 52 is closed and the timing t2 at which the DIW inlet valve is opened, such that a rise in pressure in the pipe between the chemical inlet valve 52 and the CLC 121 is suppressed, and the pressure (flow rate) upper limit error of the flow meter 1212 of the CLC 121 is prevented. In addition, it is preferable to open the chemical supply valve 122 at the same time as or before the timing t1 at which the chemical inlet valve 52 is closed. Even in the case where the degree of opening of the flow rate control valve 1211 of the CLC 121 is minimized, there is still a slight flow area, therefore, the volume of piping between the chemical inlet valve 52 and the CLC 121 can be released to the downstream side via the flow rate control valve 1211 and the chemical supply valve 122 by opening the chemical supply valve 122 at the same time as or before the timing t1 at which the chemical inlet valve 52 is closed. Accordingly, the pressure increase of the volume in the pipe between the chemical inlet valve 52 and the CLC 121 is suppressed.

As such, by providing the predetermined delay time Δts between the timing t1 at which the chemical inlet valve 52 is closed and the timing t2 at which the DIW inlet valve 70 is opened, during the delay time Δts, the rise in pressure of the volume in the pipe between the chemical inlet valve 52 and the CLC 21 may be absorbed by the pipe surface of the chemical inlet valve 52, and/or, released to the downstream side of the flow rate control valve 1211, such that a rapid rise of the pressure in the pipe at this section may be suppressed. In addition, by providing the delay time Δts, the DIW inlet valve 70 is opened after the chemical inlet valve 52 is closed certainly, such that a period in which the chemical inlet valve 52 and the DIW inlet valve 70 having a flow through area at the same time is removed certainly, and there is the advantage that the DIW from the DIW inlet valve 70 flowing back to the upstream side of the chemical inlet valve 52 is prevented.

Furthermore, it is considered that the pressure increase in the pipe between the chemical inlet valve 52 and the CLC 121, when the chemical inlet valve 52 is closed, is dependent on the distance (volume) of the pipe between the chemical inlet valve 52 and the CLC 121, the material (such as PVC resin, fluroresin) of the pipe between the chemical inlet valve 52 and the CLC 121, and/or, the supply capacity (supply pressure, supply flow rate) of the chemical inlet valve 52 and the DIW inlet valve 70. Therefore, the delay time Δts is set to a range so that the pressure upper limit error by the flow meter 1212 does not occur in consideration of the distance (volume) of the pipe between the chemical inlet valve 52 and the CLC 121, the material of the pipe between the chemical inlet valve and the CLC 121, and/or the supply capacity (supply pressure, supply flow rate) of the chemical inlet valve 52 based on testing in advance and/or calculation (such as simulation). In addition, from a viewpoint of the throughput of the device, the shorter the delay time the better. In one example, from the viewpoint of the throughput, it is preferable that the delay time is 5 seconds or less. Therefore, the delay time is sought in advance by testing in a range such that the pressure upper limit error of the flow meter 1212 does not occur and a period that is as short as possible. In the present embodiment, such a delay time Δts, for example, is set to 0.1 seconds.

In step S11, if necessary, the inside of the chemical pipe 91 may be washed with DIW by connecting the DIW supply source 30 to the chemical pipe 91. In addition, if necessary, the inside of the pipe may be washed with the DIW by opening the DIW supply valve 86 to circulate the DIW from the DIW supply source 30 to the DIW cleaning part 210 via the DIW supply pipe 81 and the pipe 250. Furthermore, in the case where the DIW is circulated in the pipe instead of the chemical during the test before shipment and is operated, some or all of the steps described above regarding step S11 may be omitted. In addition, the step S11 may be omitted, and the chemical and/or the DIW in the pipe may be replaced with nitrogen gas and dried by the circulation of nitrogen gas in the step S12.

In step S12, the DIW supply pipe 81, the chemical pipe 91, the DIW pipe 92 are each connected to a gas supply source 40, and high pressure inert gas (such as nitrogen gas) is circulated in the pipe of the cleaning device 10 from the gas supply source 40. Due to this, moisture in the pipe is blown away by the nitrogen gas, and the liquid in the pipe is drained and the inside of the pipe is dried. As a result, safety when moving the device is secured, and growth of bacteria and the like in the pipe is suppressed. Furthermore, since nitrogen gas with high supply pressure is circulated in the pipe, there is a possibility the sensor covered portion of the pressure sensor, and the sensor housing may be electrically charged with static electricity due to friction with the nitrogen gas, however as described above, the sensor covered portion 302 is electrically grounded to the housing 101 by wire, therefore the static electricity generated from friction is released to the housing 101, and accumulation on the sensor covered portion 302 is suppressed or prevented. As a result, the piping is dried in a short time with the inert gas while protecting the pressure sensor, which is an important device in terms of device operation and safety, from static electricity.

In step S13, the inlet and the outlet (including the nozzle opening) of the dried pipe of the cleaning unit 200 and the liquid supply unit 100 are appropriately closed and protected. Further, in addition to closing and protecting the nozzle opening, the liquid supply unit 100, the cleaning unit 200 and/or the pipes connected thereto are separated from each other, and the pipe opening of the liquid supply unit 100 and the cleaning unit 200 is closed for protection. After the transport preparation is completed, the cleaning unit 200 and the liquid supply unit 100 are transported. Furthermore, when checking the state of the pressure sensor, the potential of the pressure sensor in the unpressurized state is measured with a tester, to check whether the zero point position of the pressure sensor is shifted, whether the displayed value is correct and such, to check the pressure sensor is normal or not.

OTHER EMBODIMENTS (1) In the above embodiment, the cleaning device 10 is described as an example of the liquid supplying device, but the above embodiment is applicable to other liquid supplying devices. For example, it can be applicable to the polishing device, and the slurry supply device of the polishing device. In this case, in S11 of FIG. 5, the pipe is washed with $H_2O_2$ water (hydrogen peroxide water). Due to this, the components of the slurry remaining in the pipe can be melted and discharged, and abrasive grains remaining in the pipe after drying with nitrogen gas is suppressed or prevented.

(2) The above embodiment can be applied to a configuration in which some or all of the configurations of the DIW utility box 500D are not integrated. Similarly, the above-described embodiment can be applied to a configuration in which part or all of the configuration of the chemical utility box 500A is not integrated.

(3) In the above embodiment, an example in which liquid is drained by an inert gas was described for the configuration in which the number of detachable joints is reduced (FIG. 2), however, draining the liquid by an inert gas can be applied to the configuration of the comparative example of FIG. 6.

(4) In the above embodiment, draining liquid of the pipe of the liquid supplying device is described, however, even when high purity DIW is circulated in the liquid supplying device, there is a possibility the sensor covered portion exposed in the pipe, or the flow path communicating with the inside of the pipe, is electrified with static electricity, such that the configuration/method of grounding the sensor covered portion to the housing such as described in the above embodiment is effective. For example, when the chemical inlet valve 52 is closed, and the DIW inlet valve 70 is opened, and the inside of the pipe is replaced with the DIW from the DIW supply source 30, the flushing may be performed in a short time by circulating a large flow rate of DIW since the sensor covered portion is electrically grounded to the housing and protected.

Furthermore, in the case when the supplying of the chemical is started after completion of the pipe cleaning, the DIW inlet valve 70 is closed, and the chemical inlet valve 52 is opened, there is a possibility the pressure upper limit error of the flow meter 1212 may occur due to the pressure in the pipe between the DIW inlet valve 70 and the CLC 121 rising. Therefore, in the case when the supplying of the chemical is started after completion of the pipe cleaning, the DIW inlet valve 70 is closed at a time t3, and after that, after a predetermined delay time Δte, the chemical inlet valve 52 is opened at time t4. Due to this, the measured value upper limit error where the measured value of the flow meter and/or the pressure meter 53 which is included in the CLC 121 overshooting may be suppressed. In addition, by providing the delay time Δte, the chemical inlet valve 52 is opened after the DIW inlet valve 70 is closed certainly, such that a period in which the chemical inlet valve 52 and the DIW inlet valve 70 having a flow through area at the same time is removed certainly, and there is the advantage that the chemical from the chemical inlet valve 52 flowing back to the upstream side of the DIW inlet valve 70 is prevented.

The delay time Δte in the case when the supplying of the chemical is started after completion of the pipe cleaning, similar to the instance of starting the pipe cleaning, it is considered that the pressure increase in the pipe between the DIW inlet valve 70 and the CLC 121 when the DIW inlet valve 70 is closed, is dependent on the distance (volume) of the pipe between the DIW inlet valve 70 and the CLC 121, the material (such as PVC resin, fluroresin) of the pipe between the DIW inlet valve 70 and the CLC 121, and/or, the supply capacity (supply pressure, supply flow rate) of the chemical inlet valve 52 and the DIW inlet valve 70. Therefore, the delay time Δte is set to a range so that the pressure upper limit error by the flow meter 1212 does not occur in consideration of the distance (volume) of the pipe between the DIW inlet valve 70 and the CLC 121, the chemical inlet valve 52, the material of the pipe between the DIW inlet valve 70 and the CLC 121, and/or the supply capacity (supply pressure, supply flow rate) of the chemical inlet valve 52 and the DIW inlet valve 70 based on testing in advance and/or calculation (such as simulation). In addition, similar to the instance of starting the pipe cleaning, in view of the throughput, a period that is as short as possible, and in a range such that the pressure upper limit error of the flow meter 1212 does not occur is sought in advance by testing and/or calculation (such as simulation). As a result, even in the case when the supplying of the chemical is started after completion of the pipe cleaning, a rapid rise of the pressure in the pipe between the DIW inlet valve 70 (chemical inlet valve 52) and the CLC 121 is suppressed, and the pressure upper limit error of the flow meter 1212 is suppressed. The delay time Δte, for example, may be the same as the delay time Δts. In the present embodiment, the delay time Δts and Δte, for example, may be set to 0.1 seconds.

Figure 7:
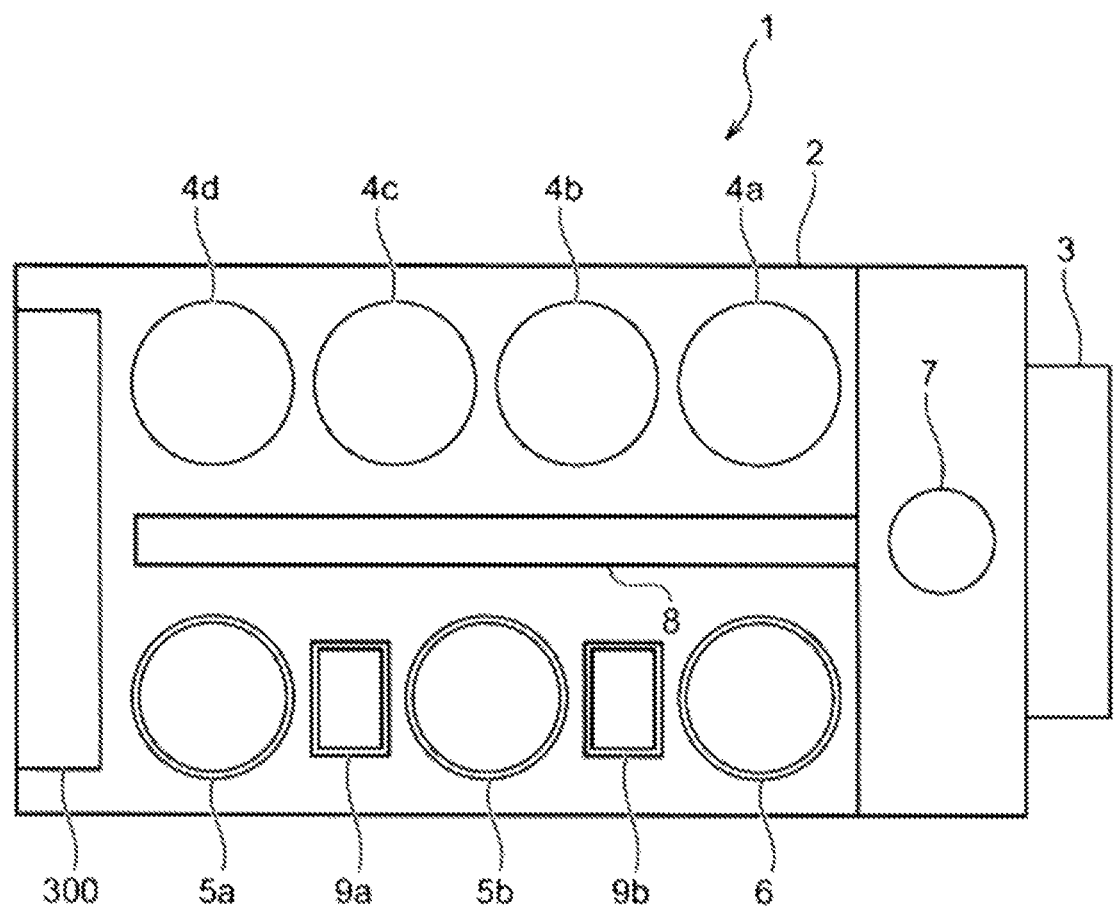
FIG. 7 is a schematic diagram showing a substrate polishing device according to an embodiment of the disclosure.
Figure 8:
FIG. 8 is a schematic diagram showing a substrate (S) according to an embodiment of the disclosure.

FIG. 7 is a schematic diagram showing a substrate polishing device according to an embodiment of the disclosure. Referring to FIG. 7, a substrate polishing device 1 includes a housing 2 in an about rectangular shape and a load port 3 on which a substrate cassette, which stocks a plurality of substrates such as semiconductor wafers, is placed. An open cassette, a Standard Manufacturing Interface (SMIF) pod, or a Front Opening Unified Pod (FOUP) can be mounted on the load port 3. The housing 2 internally houses a plurality of (in this example, four) polishing units 4a to 4d, cleaning units 5a and 5b, which clean the substrate after polishing, and a drying unit 6, which dries the substrate after cleaning. The cleaning unit 10 according to the embodiment of the present invention is applied to at least one of the cleaning units 5a and 5b.

The polishing process in the polishing units for polishing a substrate, is a Chemical Mechanical Polishing (CMP) process which utilizes polishing slurry solution. However, in other embodiments, for example, a simple polishing process for substrates without using polishing slurry, or a substrate grinding process may be adopted.

At least the following aspects may be understood from the description of the embodiments.

In a first embodiment, a method for draining a liquid of a pipe of a liquid supplying device including a step for drying an inside of the pipe by circulating an inert gas in the pipe without dividing the pipe of the liquid supplying device, wherein the step for drying includes a step for protecting a pressure sensor from a static electricity by electrically connecting a sensor covered portion of the pressure sensor with a housing of the liquid supplying device, the sensor covered portion is exposed to the inside of the pipe or exposed to a flow path communicating with the inside of the pipe. The liquid supplying device is, for example, a cleaning unit, a polishing unit, an etching processing unit, a developing process unit, and a plating processing unit, and at least one unit supplying a chemical and/or a DIW to the aforementioned units.

According to this embodiment, liquid of the pipe may be drained without dividing the pipe by drying the inside of the pipe of the liquid supplying device with an inert gas. In addition, since the sensor covered portion of the pressure sensor is electrically grounded to the housing of the liquid supplying device, the pressure sensor is protected from the static electricity generated by the inert gas and the sensor covered portion. For example, even in the case when a large flow rate of inert gas is circulated in the pipe, the pressure sensor, that is a important device, may be properly protected from static electricity, such that the work time may be shortened by drying with a large flow rate of inert gas.

Since there is no need to divide the pipe, a work space near the pipe connection is not required, and the labor for draining the liquid is reduced, and the work time is shortened. Furthermore, reassembly of divided pipes are not needed, and the possibility for a leak occurring from the pipe connections is suppressed. In addition, there is no need to divide the pipes to drain the liquid, therefore the number of pipe connections (detachable joint) may be reduced.

In a second embodiment, the method according to the first embodiment, wherein the pipe has a branch part integrally formed without a joint detachably connecting the pipe.

According to this embodiment, even in the case where it is difficult to drain the liquid by dividing the pipe because the detachable joint (union) is omitted and the branch part is included, the liquid in the pipe can be appropriately drained by the inert gas.

In the third embodiment, the method according to one of methods of the first and second embodiment, wherein the liquid supplying device is a cleaning device, and the method further includes a step for circulating a DIW inside the pipe of the cleaning device, before the step for drying.

According to this embodiment, since the liquid is drained by cleaning the inside of the pipe with DIW and then drying with an inert gas, the chemical components of the treatment liquid and the like remaining in the pipe after drying is prevented.

In the fourth embodiment, the method according to one of the first and second embodiment, wherein the liquid supplying device is a slurry supply device, and the method further includes a step for cleaning a slurry inside the pipe of the slurry supply device by a chemical, before the step for drying.

According to this embodiment, the liquid is drained by cleaning the inside of the pipe using $H_2O_2$ and such chemical, and then drying with an inert gas, so that abrasive grains and the like included in the slurry remaining in the pipe after drying is prevented. In addition, cleaning with pure water after cleaning with a chemical.

In the fifth embodiment, the method according to one of the first to fourth embodiment, wherein the inert gas is a nitrogen gas, and the nitrogen gas is circulated inside the pipe with a supply pressure in a range of 200 kPa or more to 300 kPa or less.

According to this embodiment, an appropriate gas is circulated inside the pipe at a sufficiently high pressure, such that the drying time is shortened, and the work time required for the draining the liquid is shortened. In addition, by using nitrogen gas which may be obtained at a relatively low cost, a cost increase may be suppressed or prevented.

In the sixth embodiment, the method according to one of the first to fifth embodiment, wherein in order to perform switchings of a supply of a first liquid and a supply of a second liquid to a flow rate control device, below steps are included before the step for drying: a step for switching an opening/closing of a first valve which controls the supply of the first liquid to the flow rate control device disposed on the pipe, and a step for switching an opening/closing of a second valve which controls the supply of the second liquid to the flow rate control device, wherein the step for switching the opening/closing of the second valve is performed at a predetermined delay time after the step for switching the opening/closing of the first valve. The first and second valves are, for example, solenoid valves.

According to this embodiment, by providing a delay time between the switching of the first valve and the switching of the second valve, a pressure rise/flow rate rise in the pipe between each valve and the flow rate control device is suppressed, and the measured value upper limit error (pressure upper limit error/flow rate upper limit error) of a sensor such as the flow meter of the flow rate control device may be suppressed. In a case where a distance of the pipe between each valve and the flow rate control device is short (the volume is small), especially, when switching the first and second valve, it is possible the pressure/flow rate inside the pipe between each valve and the flow rate control device increases, however in the present embodiment, the rise in pressure/flow rate inside the pipe at this section may be effectively suppressed by providing the delay time between the switching of each valve. Therefore, when integrating each component to reduce the size of the liquid supplying device, the measured error (for example, measured value upper limit error) of the sensor stemming from the distance between each component becoming shorter (flow path volume is small) may be suppressed. As a result, each component of the liquid supplying device is integrated to reduce the size of the liquid supplying device. In addition, while the measured error of the sensor may be suppressed or prevented, the liquid circulated in the pipe is switched (for example, chemical to pure water) to quickly flush the inside of the pipe, and then draining of the liquid inside the pipe is performed by inert gas after.

In the seventh embodiment, the method according to the sixth embodiment, wherein when the switchings of the supply of the first liquid and the supply of the second liquid to the flow rate control device are performed, the switching of the second valve from closed to open is performed at a first delay time after the first valve is switched from open to closed, and/or, the switching of the first valve from closed to open is performed at a second delay time after the second valve is switched from open to closed.

According to this embodiment, when the supply of the first liquid and the supply of the second liquid to the flow rate control device is switched, the pressure rise/flow rate rise inside of the pipe between each valve and the flow rate control device is suppressed, and the measured value upper limit error of the sensor such as the flow meter of the flow rate control device is suppressed.

In the eighth embodiment, the method according to the sixth or seventh embodiment, wherein the flow rate control device includes a flow meter, and a flow rate control valve which controls a flow rate of the first liquid and/or the second liquid according to a measured value of the flow meter, and the predetermined delay time is set to a time so that a pressure upper limit error by the flow meter does not occur during the switching of the first valve and/or the second valve.

According to this embodiment, the range where the measured value upper limit of the flow rate control device such as the CLC does not occur is obtained based on testing in advance and/or calculations, such that the measured value upper limit error of the flow meter is suppressed.

In the ninth embodiment, the method according to the eighth embodiment, wherein the flow meter is a differential pressure type flow meter or an ultrasonic flow meter.

According to this embodiment, the pressure upper limit error of the differential pressure type flow meter, the pressure upper limit error of the ultrasonic flow meter is suppressed.

In the tenth embodiment, a liquid supplying device, including a pipe including a branch pipe having a branch part, wherein the branch part is integrally formed without a joint, and a pressure sensor that has a sensor covered portion exposed to an inside of the pipe or exposed to a flow path communicating with the inside of the pipe, wherein the sensor covered portion is electrically connected with a housing of the liquid supplying device is provided.

According to this embodiment, in the case when the branch part of the pipe cannot divided, the pressure sensor is protected from static electricity, the pipe dried by circulating inert gas, and the liquid draining work performed.

In the eleventh embodiment, a liquid supplying device including, a flow rate control device measuring a flow rate of a liquid and controlling the flow rate according to a measured value, a first valve connected to the flow rate control device and controlling a supply of a first liquid to the flow rate control device, a second valve connected to the flow rate control device and controlling a supply of a second liquid to the flow rate control device, wherein the control device sets a delay time between a time for switching on/off the first valve and a time for switching on/off the second valve and performs the switchings of the first valve and the second valve. The first and second valves are, for example, solenoid valves.

According to this embodiment, by providing a delay time between the time of the switching of the first valve and the time of the switching of the second valve, a pressure rise/flow rate rise in the pipe between each valve and the flow rate control device is suppressed, and the measured value upper limit error (pressure upper limit error/flow rate upper limit error) of a sensor such as the flow meter of the flow rate control device may be suppressed. In a case where a distance of the pipe between each valve and the flow rate control device is short (the volume is small), especially, when switching the first and second valve, it is possible the pressure/flow rate inside the pipe between each valve and the flow rate control device increases, however in the present embodiment, the rise in pressure/flow rate inside the pipe at this section may be effectively suppressed by providing the delay time between the switching of each valve. Therefore, when integrating each component to reduce the size of the liquid supplying device, the measured error (for example, measured value upper limit error) of the sensor stemming from the distance between each component becoming shorter (flow path volume is small) may be suppressed. As a result, each component of the liquid supplying device is integrated to reduce the size of the liquid supplying device. In addition, while the measured error of the sensor may be suppressed or prevented, the liquid circulated in the pipe is switched (for example, chemical to pure water) to quickly flush the inside of the pipe, and then draining of the liquid inside the pipe is performed by inert gas after.

In the twelfth embodiment, the liquid supplying device according to the eleventh embodiment, wherein when the switchings of the supply of the first liquid and the supply of the second liquid to the flow rate control device are performed, the control device performs the switching of the second valve from closed to open at a first delay time after the first valve is switched from open to closed, and/or, performs the switching of the first valve from closed to open at a second delay time after the second valve is switched from open to closed.

According to this embodiment, when the switchings of the supply of the first liquid and the supply of the second liquid to the flow rate control device are performed, the pressure rise/flow rate rise inside of the pipe between each valve and the flow rate control device is suppressed, and the measured value upper limit error of the sensor such as the flow meter of the flow rate control device is suppressed.

In the thirteenth embodiment, the liquid supplying device according to the eleventh or twelfth embodiment, wherein the flow rate control device includes a flow meter, and a flow rate control valve which controls a flow rate of the first liquid and/or the second liquid according to a measured value of the flow meter, and the delay time is set to a time so that a pressure upper limit error by the flow meter does not occur during the switching of the first valve and/or the second valve.

According to this embodiment, the range where the measured value upper limit of the flow rate control device such as the CLC does not occur is obtained based on testing in advance and/or calculations, such that the measured value upper limit error of the flow meter is suppressed.

In the fourteenth embodiment, the liquid supplying device according to the thirteenth embodiment, wherein the flow meter is a differential pressure type flow meter or an ultrasonic flow meter.

According to this embodiment, the pressure upper limit error of the differential pressure type flow meter, the pressure upper limit error of the ultrasonic flow meter is suppressed.

In the fifteenth embodiment, the liquid supplying device according to one of the eleventh to fourteenth embodiment, wherein the flow rate control device, the first valve and the second valve are disposed in a single module.

According to this embodiment, integrating inside a single module, a rapid rise of the pressure in the pipe due to switching of the valves and the measured error of the sensor may be suppressed even in the configuration in which a distance between the flow rate control device and each of the valves are short.

In the sixteenth embodiment, the liquid supplying device according to one of the eleventh to fifteenth embodiment, wherein a cleaning device including a cleaning unit connected to the liquid supplying device is provided.

According to this embodiment, in the functional effect described above is achieved in the liquid supplying device of the cleaning device.

In the seventeenth embodiment, the liquid supplying device according to one of the sixteenth embodiment, the first liquid is a chemical used by the cleaning unit, the second liquid is a second chemical or pure water for cleaning a flow path of the liquid supplying device.

According to this embodiment, a pressure rising inside the pipe during a start and/or end of cleaning the pipe of the cleaning device is suppressed, and the measured error of the sensor occurring is suppressed.

In the eighteenth embodiment, a substrate processing device having the cleaning device according to embodiment sixteen or seventeen is provided.

According to this embodiment, in the functional effect described above is achieved in the cleaning unit of the substrate processing device (polishing device, plating device, etching device, developing device and the like).

In the nineteenth embodiment, a substrate processing device including the liquid supplying device according to one of the eleventh to fifteenth embodiment, a liquid processing device connected to the liquid supplying device is provided, wherein the first liquid is a third chemical used by the liquid processing device, the second liquid is a fourth chemical or pure water used by the liquid processing device. The liquid processing device, for example, includes at least one of the cleaning unit, the polishing unit, the etching unit, the developing unit, and the plating unit.

According to this embodiment, in the liquid processing device, the pressure rise inside the pipe due to switching the valve when diluting the chemical and/or mixing is suppressed, and the measured error of the sensor occurring is suppressed.

In the twentieth embodiment, a method of supplying liquid, in order to perform switchings of the supply of a first liquid and the supply of a second liquid to a flow rate control device disposed at the pipe of the liquid supplying device, including a step for switching an opening/closing of a first valve which controls the supply of the first liquid to the flow rate control device disposed on the pipe, and a step for switching an opening/closing of a second valve which controls the supply of the second liquid to the flow rate control device, wherein the step for switching the opening/closing of the second valve is performed at a predetermined delay time after the step for switching the opening/closing of the first valve.

According to this embodiment, the functional effect described in the eleventh embodiment is achieved.

In the twenty first embodiment, a substrate processing device, including the liquid supplying device according to the tenth embodiment, and a processing device which supplies a liquid supplied from the liquid supplying device to a substrate to process the substrate is provided.

According to this embodiment, in the substrate processing device including the liquid supplying device, the functional effect described in the tenth embodiment is achieved.

In the twenty second embodiment, a substrate polishing device, including a polishing part for polishing a substrate, and a cleaning part for cleaning the substrate which has been polished, the liquid supplying device according to the tenth embodiment supplying a liquid to at least one of the cleaning part and the polishing part is provided.

According to this embodiment, in the substrate polishing device including the liquid supplying device supplying liquid to the cleaning part and/or the polishing part, the functional effect described in the tenth embodiment is achieved.

Although the embodiments of the disclosure have been described above based on some examples, the embodiments of the disclosure described above are for the purpose of facilitating understanding of the disclosure and are not intended to limit the disclosure. The disclosure can be modified and improved without departing from the spirit of the disclosure, and it goes without saying that the disclosure includes equivalents thereof. In addition, in the range in which at least a part of the problems described above can be solved, or in the range in which at least a part of the effect is achieved, any combination of the constituent elements described in the claims and the specification, or the omission thereof, is possible.

REFERENCE SIGNS LIST

10 Cleaning device
20 Chemical supply source
30 DIW Supply source
40 Gas supply source
51 Manual valve
52 Chemical inlet valve
53 Pressure sensor
70 DIW Inlet valve
74 Pressure sensor
76 Pressure sensor
77 DIW Pressure regulator
78 In-line mixer
79 Junction
81 DIW Supply pipe
82 DIW Branch pipe
83 DIW Pipe
86 DIW Supply valve
87 DIW Pressure regulator
88 DIW Pressure sensor
91 Chemical pipe
92 DIW Pipe
93 Chemical Pipe
96 Cleaning chemical pipe
111 DIWCLC
112 DIW Supply valve
121 Chemical CLC
122 Chemical supply valve
100 Liquid supply unit
101 Housing
110 CLC Box
120 CLC Box
150 Control Device
200 Cleaning unit
210 DIW Cleaning part
220 Chemical cleaning part
221 Upper nozzle
222 Lower nozzle
223 Standby part
231~234 Valve
240~249, 240A, 242A Pipe
300 Housing
301 Diaphragm
302 Protective Film (Sensor covered portion)
500A~500C Chemical utility box
500D DIW Utility box
501 Device area

What is claimed is:

1. A method for draining a liquid of a pipe of a liquid supplying device, the liquid supplying device comprising:
   the pipe;
   a gas supply source, supplying an inert gas to the pipe;
   a housing;
   a pressure sensor;
   a sensor cover, covering the pressure sensor, the sensor cover is exposed to an inside of the pipe or exposed to a flow path communicating with the inside of the pipe;
   the method comprising:
      a step of protecting the pressure sensor from static electricity by electrically connecting the sensor cover with the housing of the liquid supplying device;
      a step of drying the inside of the pipe by supplying the inert gas to the pipe without dividing the pipe of the liquid supplying device; and
      a step of generating friction between the sensor cover and the inert gas, wherein the inert gas is supplied inside the pipe with a supply pressure in a range of 200 kPa or more to 300 kPa or less to generate the friction between the sensor cover and the inert gas, and the method further includes a step of supplying de-ionized water inside the pipe before the step for drying.

2. The method according to claim 1, wherein the pipe has a branch part integrally formed without a joint detachably connecting the pipe.

3. The method according to claim 1, wherein the liquid supplying device is a cleaning device.

4. The method according to claim 1, wherein the liquid supplying device is a slurry supplying device and the pipe is a pipe of the slurry supply device,
   and the method further includes a step for cleaning a slurry inside the pipe of the slurry supply device by a chemical, before the step of supplying de-ionized water inside the pipe.

5. The method according to claim 1, wherein the inert gas is a nitrogen gas.

6. The method according to claim 1, wherein the flow meter is a differential pressure type flow meter or an ultrasonic flow meter.

* * * * *